United States Patent
Kumar

(10) Patent No.: US 8,288,646 B2
(45) Date of Patent: Oct. 16, 2012

(54) PYROELECTRIC SOLAR TECHNOLOGY APPARATUS AND METHOD

(75) Inventor: Santosh Kumar, San Jose, CA (US)

(73) Assignee: UltraSolar Technology, Inc., San Jose, CA (US)

(*) Notice: Subject to any disclaimer, the term of this patent is extended or adjusted under 35 U.S.C. 154(b) by 0 days.

(21) Appl. No.: 13/160,530

(22) Filed: Jun. 15, 2011

(65) Prior Publication Data

US 2011/0232734 A1   Sep. 29, 2011

Related U.S. Application Data

(63) Continuation of application No. 13/036,031, filed on Feb. 28, 2011, which is a continuation of application No. 12/774,756, filed on May 6, 2010.

(60) Provisional application No. 61/175,914, filed on May 6, 2009, provisional application No. 61/307,911, filed on Feb. 25, 2010, provisional application No. 61/267,492, filed on Dec. 8, 2009, provisional application No. 61/263,388, filed on Nov. 22, 2009, provisional application No. 61/263,328, filed on Nov. 20, 2009.

(51) Int. Cl.
*H01L 31/042* (2006.01)
*H01L 31/00* (2006.01)

(52) U.S. Cl. ........................................ 136/255; 136/248

(58) Field of Classification Search .................. None
See application file for complete search history.

(56) References Cited

U.S. PATENT DOCUMENTS

| | | | |
|---|---|---|---|
| 3,648,134 A | 3/1972 | Audeh et al. | |
| 4,037,029 A | 7/1977 | Anderson | |
| 4,563,642 A | 1/1986 | Munakata et al. | |
| 4,656,463 A | 4/1987 | Anders et al. | |
| 4,822,568 A | 4/1989 | Tomita | |
| 4,827,395 A | 5/1989 | Anders et al. | |
| 5,340,409 A | 8/1994 | Tsuzuki et al. | |
| 5,760,558 A | 6/1998 | Popat | |
| 6,512,385 B1 | 1/2003 | Pfaff et al. | |
| 6,677,214 B1 | 1/2004 | Shindo et al. | |
| 6,803,777 B2 | 10/2004 | Pfaff et al. | |
| 6,819,467 B2 | 11/2004 | Lynam | |
| 6,882,388 B2 | 4/2005 | Sugiura et al. | |
| 6,972,577 B2 | 12/2005 | Pfaff et al. | |
| 7,208,089 B2 | 4/2007 | Montemagno et al. | |
| 7,259,322 B2 | 8/2007 | Gronet | |
| 7,323,634 B2 | 1/2008 | Speakman | |
| 7,323,889 B2 | 1/2008 | Pfaff et al. | |

(Continued)

FOREIGN PATENT DOCUMENTS

EP   239690 A2   10/1987

(Continued)

*Primary Examiner* — Jonathan Johnson
*Assistant Examiner* — Shannon Gardner
(74) *Attorney, Agent, or Firm* — Raj Abbyanker, P.C.

(57) ABSTRACT

A method to increase the efficiency of a solar cell comprises depositing a pyroelectric film on a surface of the solar cell and generating an electromotive force to bias the solar cell. The method also includes creation of an open circuit voltage. Further, the method includes increasing a short circuit current through the pyroelectric film and creating a sustained temperature variation in the solar cell. A constant temporal temperate gradient is created in the pyroelectric film to increase the short circuit current with a temperature. Further, a p-n junction is biased with the electromotive force produced from the pyroelectric film.

1 Claim, 7 Drawing Sheets

U.S. PATENT DOCUMENTS

| | | |
|---|---|---|
| 7,420,687 B2 | 9/2008 | Pfaff |
| 7,480,019 B2 | 1/2009 | Itami et al. |
| 7,718,144 B2 | 5/2010 | Monzyk et al. |
| 7,728,958 B2 | 6/2010 | Pfaff |
| 7,773,230 B2 | 8/2010 | Pfaff |
| 7,863,157 B2 | 1/2011 | Henley et al. |
| 7,880,082 B2 | 2/2011 | Morooka et al. |
| 7,903,210 B2 | 3/2011 | Sugiura et al. |
| 2002/0180961 A1 | 12/2002 | Wack et al. |
| 2002/0180985 A1 | 12/2002 | Wack et al. |
| 2002/0180986 A1 | 12/2002 | Nikoonahad et al. |
| 2002/0182760 A1 | 12/2002 | Wack et al. |
| 2002/0188417 A1 | 12/2002 | Levy et al. |
| 2002/0190207 A1 | 12/2002 | Levy et al. |
| 2003/0011786 A1 | 1/2003 | Levy et al. |
| 2003/0057972 A1 | 3/2003 | Pfaff et al. |
| 2003/0067312 A1 | 4/2003 | Pfaff et al. |
| 2004/0046577 A1 | 3/2004 | Pfaff et al. |
| 2004/0073398 A1 | 4/2004 | Nikoonahad et al. |
| 2004/0092045 A1 | 5/2004 | Bultman et al. |
| 2004/0115843 A1 | 6/2004 | Wack et al. |
| 2004/0144754 A1 | 7/2004 | Itami et al. |
| 2004/0235205 A1 | 11/2004 | Levy et al. |
| 2004/0243051 A1 | 12/2004 | Monzyk et al. |
| 2005/0025680 A1 | 2/2005 | Monzyk et al. |
| 2005/0081908 A1 | 4/2005 | Stewart |
| 2005/0134768 A1 | 6/2005 | Sugiura et al. |
| 2005/0156609 A1 | 7/2005 | Pfaff et al. |
| 2005/0260786 A1 | 11/2005 | Yoshikawa et al. |
| 2005/0263182 A1 | 12/2005 | Morooka et al. |
| 2006/0072807 A1 | 4/2006 | Bultman et al. |
| 2007/0018662 A1 | 1/2007 | Pfaff |
| 2007/0019209 A1 | 1/2007 | Pfaff |
| 2007/0146887 A1 | 6/2007 | Ikeda et al. |
| 2007/0235074 A1 | 10/2007 | Henley et al. |
| 2008/0093532 A1 | 4/2008 | Choe |
| 2008/0128017 A1 | 6/2008 | Ford |
| 2008/0170982 A1 | 7/2008 | Zhang et al. |
| 2008/0186580 A1 | 8/2008 | Pfaff |
| 2009/0002717 A1 | 1/2009 | Pfaff |
| 2009/0148616 A1 | 6/2009 | Itami et al. |
| 2009/0159123 A1 | 6/2009 | Kothari et al. |
| 2009/0301382 A1 | 12/2009 | Patel |
| 2010/0062560 A1 | 3/2010 | Farris et al. |
| 2010/0091292 A1 | 4/2010 | Pfaff |
| 2010/0180945 A1 | 7/2010 | Henley et al. |
| 2010/0243021 A1 | 9/2010 | Lee et al. |
| 2010/0252094 A1 | 10/2010 | Kim et al. |
| 2010/0282310 A1 | 11/2010 | Tsoi et al. |
| 2011/0000537 A1 | 1/2011 | Myong |
| 2011/0011456 A1 | 1/2011 | Han et al. |
| 2011/0041895 A1* | 2/2011 | Carroll .................. 136/250 |
| 2011/0126891 A1 | 6/2011 | Goto et al. |

FOREIGN PATENT DOCUMENTS

| | | |
|---|---|---|
| EP | 1494246 A1 | 1/2005 |
| EP | 1536508 A1 | 6/2005 |
| EP | 727823 B1 | 3/2007 |
| EP | 1770717 A1 | 4/2007 |
| EP | 2040304 A1 | 3/2009 |
| EP | 2169724 A1 | 3/2010 |
| EP | 2180520 A1 | 4/2010 |
| EP | 2323170 A1 | 5/2011 |
| WO | 9741307 A1 | 11/1997 |
| WO | 03011359 A2 | 2/2003 |
| WO | 03011445 A2 | 2/2003 |
| WO | 2005063484 A1 | 7/2005 |
| WO | 2005101525 A2 | 10/2005 |
| WO | 2006000834 A1 | 1/2006 |
| WO | 2007015710 A2 | 2/2007 |
| WO | 2007109568 A2 | 9/2007 |
| WO | 2007117453 A2 | 10/2007 |
| WO | 2009042497 A2 | 4/2009 |
| WO | 2009044996 A1 | 4/2009 |
| WO | 2009085601 A2 | 7/2009 |
| WO | 2010083120 A2 | 7/2010 |
| WO | 2011004415 A1 | 1/2011 |

* cited by examiner

PYROELECTRIC SOLAR TECHNOLOGY APPARATUS AND METHOD

CLAIM OF PRIORITY

This application is a continuation of:
U.S. Utility application Ser. No. 13/036,031 titled "PYROELECTRIC SOLAR TECHNOLOGY APPARATUS AND METHOD" filed on Feb. 28, 2011.
and claims priority to the following:
U.S. Utility application Ser. No. 12/774,756 titled "METHOD TO IMPROVE EFFICIENCY OF A SOLAR CELL" filed on May 6, 2010;
U.S. Provisional Application No. 61/175,914, titled "METHOD TO IMPROVE EFFICIENCY OF A SOLAR CELL" filed on May 6, 2009;
U.S. Provisional Application No. 61/307,911 titled "USING RE-RADIATED ENERGY TO HARVEST PYROELECTRIC POWER" filed on Feb. 25, 2010;
U.S. Provisional Application No. 61/267,492 titled "USING ELECTRIC FIELD TO HARVEST ENERGY FROM PYROELECTRIC" filed on Dec. 8, 2009;
U.S. Provisional Application No. 61/263,388 titled "THERMAL METHODS TO INCREASE EFFICIENCY OF PHOTOVOLTAIC POWER SOURCE" filed on Nov. 22, 2009; and
U.S. Provisional Application No. 61/263,328 titled "METHOD OF THERMAL ENERGY HARVESTING USING PYROELECTRIC" filed on Nov. 20, 2009; the disclosures of which are hereby incorporated by reference.

FIELD OF TECHNOLOGY

This disclosure relates generally to the technical fields of thermal energy harvesting using pyroelectric, and in one example embodiment, a method, apparatus and system of thermal energy harvesting in solar cells using a pyroelectric is disclosed.

BACKGROUND

The efficiency of a solar cell may be its capability to convert the solar energy incident on it to electrical energy. The theoretical maximum efficiency of a single junction solar cell may be the ratio of the area of the rectangle with the longer side along the y axis representing the number of photons as a function of incident energy and the shorter side along the x-axis representing the energy to the area under the curve of energy vs. number of incident photons per unit area per second.

For silicon solar cell made of single crystalline silicon the theoretical maximum efficiency may be less than 30%. Remainder of the solar energy incident on a solar cell may be lost as heat.

SUMMARY

Disclosed are a method, an apparatus and/or system of pyroelectric solar technology.

In one aspect, a method to increase the efficiency of a solar cell includes depositing a pyroelectric film on a surface of the solar cell and generating an electromotive force to bias the solar cell. The method also includes creating an open circuit voltage. The method further includes increasing a short circuit current through the pyroelectric film and creating a sustained temperature variation in the solar cell. Further, the method includes creating a constant temporal temperate gradient in the pyroelectric film to increase the short circuit current with a temperature and biasing a p-n junction of the solar cell with the electromotive force produced from the pyroelectric film.

In another aspect, a solar cell includes a pyroelectric film. The solar cell further includes a semiconductor device provided directly on a surface of the solar cell and the pyroelectric film deposited on the surface of the solar cell that includes the semiconductor device.

In yet another aspect, a photovoltaic power generation apparatus includes a solar cell, a current collecting wiring provided on one of a transparent pyroelectric film and an opaque pyroelectric film. The photovoltaic power generation apparatus also includes a semiconductor device provided directly on the current collecting wiring. The transparent pyroelectric film is deposited on a first side of the solar cell and the opaque pyroelectric film is deposited on a second side of the solar cell.

The methods and systems disclosed herein may be implemented in any means for achieving various aspects, and may be executed in a form of a machine-readable medium embodying a set of instructions that, when executed by a machine, cause the machine to perform any of the operations disclosed herein. Other features will be apparent from the accompanying drawings and from the detailed description that follows.

BRIEF DESCRIPTION OF THE DRAWINGS

The embodiments of this invention are illustrated by way of example and not limitation in the figures of the accompanying drawings, in which like references indicate similar elements and in which.

Other features of the present embodiments will be apparent from the accompanying drawings and from the detailed description.

DETAILED DESCRIPTION

Disclosed are a method, an apparatus and/or a system of pyroelectric solar technology. Although the present embodiments have been described with reference to specific example embodiments, it will be evident that various modifications and changes may be made to these embodiments without departing from the broader spirit and scope of the various embodiments.

In one or more embodiments, a pyroelectric material may be a material that produces a voltage across its surface when subjected to a change in temperature and a solar cell may be a solid state device that converts solar energy into electricity.

In one or more embodiments, the pyroelectric material may be used with the solar cell to increase the electrical output efficiency of the solar cell. The electrical output efficiency may be a ratio of the electricity produced by the solar cell to the total input solar energy incident on the solar cell. A large percentage of incident energy or photons those are incident on a solar cell that produce heat may not be utilized by the solar cell to produce electricity. Disclosed is a system and method that utilizes thermally conductive materials to convert the heat generated from the incident energy that was not utilized earlier to produce electricity. In one more embodiments, the solar cell may be replaced by other power generation devices. Power generation devices may include devices that generate power to operate an electrical component.

In an example embodiment, one or more layers of pyroelectric material may be deposited on the solar cell. The pyroelectric material may be applied to the solar cell during the manufacturing process and/or applied so that the solar cell may be modified by such application of the pyroelectric to it.

Figure 1:
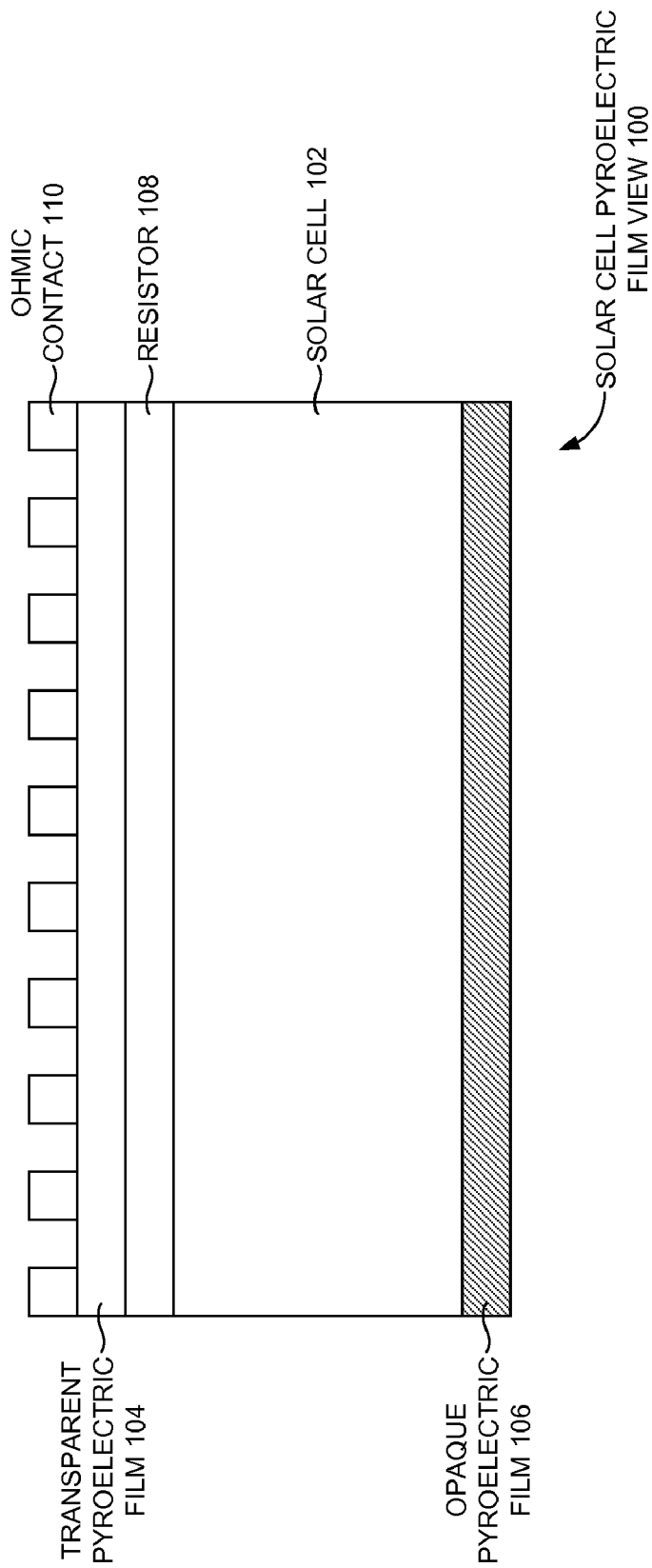
FIG. 1 is a schematic view of a solar cell with pyroelectric film, according to one or more embodiments.

FIG. 1 shows a solar cell pyroelectric view 100, according to one or more embodiments. In one or more embodiments, a transparent pyroelectric film 104 and/or a plurality of pyroelectric films in a stack may be applied to a front surface of the solar cell 102. In one or more embodiments, an opaque pyroelectric film 106 and/or plurality of opaque films in a stack may be applied to another surface of the solar cell 102. In one or more embodiments, the transparent pyroelectric film 104 may be applied on to a resistor 108 that is placed on a front surface of the solar cell 102. In one or more embodiments, ohmic contact 110 may be placed onto the transparent pyroelectric film 104 in form of a semiconductor device. In or more embodiments, a region of the semiconductor device may be prepared to act as an ohmic contact 110. The region of the semiconductor behaving as the ohmic contact 110 may be prepared such that the current-voltage curve of the semiconductor device is linear and symmetric.

Figure 2:
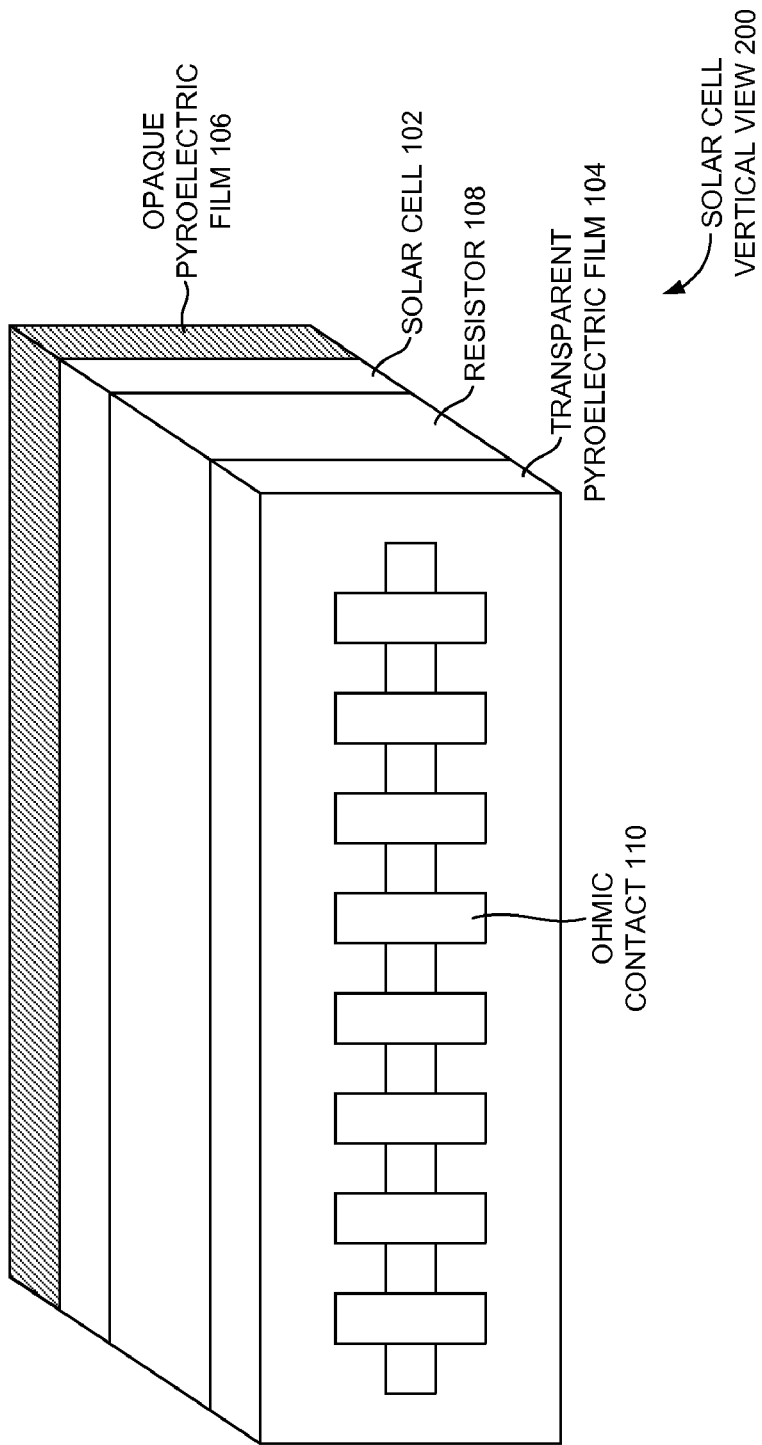
FIG. 2 is a schematic representation of the vertical view of a solar cell, according to one or more embodiments.

FIG. 2 shows solar cell vertical view 200, according to one or more embodiments. In one or more embodiments, solar cell 102 may generate heat due to solar irradiance. The solar irradiance may heat the transparent pyroelectric film 104 and/or opaque pyroelectric film 106. In one or more embodiments, due to the heating of the transparent pyroelectric film 104 and/or opaque pyroelectric film 106, an electromotive force may be generated to bias the solar cell 102 such that an open circuit voltage that is created. In one or more embodiments, the open circuit voltage may be established using a predetermined voltage and/or a current to reach an appropriate operating point of the solar cell 102. For example, electromotive force (EMF) produced due to heat may be 50 mV per mJ, with 930 W of solar energy per square meter, approximately 500 mV EMF is produced. In one or more embodiments, the electromotive force may be added to the open circuit voltage of the solar cell 102. For example, a solar cell with open circuit voltage=500 mV that may be without a pyroelectric material that is applied to it will have an effective open circuit voltage of 1000 mV with the pyroelectric material applied to it.

Figure 3:
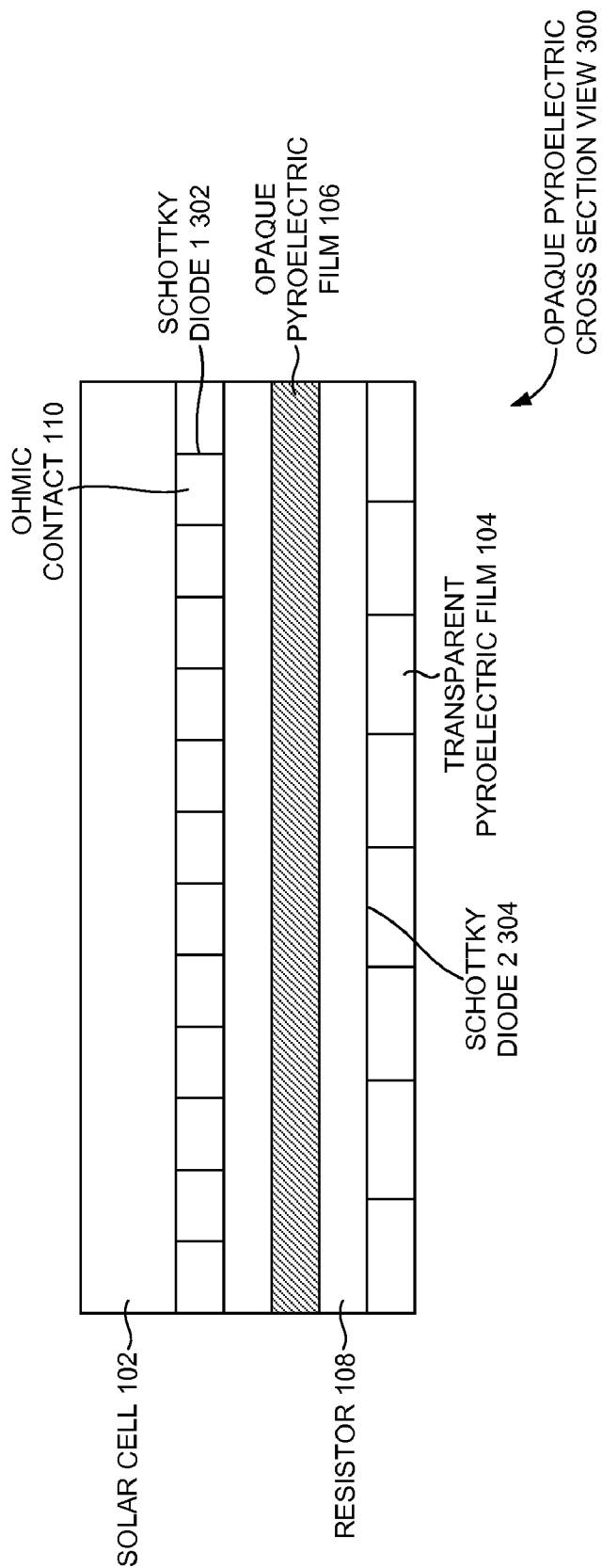
FIG. 3 is a schematic representation of the cross section of an opaque pyroelectric film, according to one or more embodiments.

FIG. 3 shows an opaque pyroelectric cross section view 300, according to one or more embodiments. In one or more embodiments, the EMF produced by the opaque pyroelectric material 106 and/or transparent pyroelectric material 104 may be further used to generate electric current using a generation device such as a Shottky diode (e.g., Shottky diode 1 302 and Shottky diode 2 304).

In one or more embodiments, FIG. 3 shows the integration of opaque pyroelectric material 106 in the solar ell 102. In one or more embodiments, Shottky diode 1 302 may be formed by deposition of Shottky creating metal on the surface of the solar cell 102. Ohmic contacts 110 may be created on the rest of the surface of the solar cell 102 where the Shottky is created. In one or more embodiments, opaque pyroelectric film 106 and/or transparent pyroelectric film may be deposited below this surface through deposition techniques such as sputtering and/or screen printing. In one or more embodiments, heat from the Sun and/or wasted heat causes current in the pyroelectric material (e.g., opaque pyroelectric material 106 and transparent pyroelectric material 104), thus increasing the total current of the solar cell 102. In one or more embodiments, resistor 108 may be deposited below the layer of the opaque pyroelectric film 106. In one or more embodiments, when high current passes through the resistor 108, the resistor 108 may produce heat which causes the opaque pyroelectric film 106 which is deposited next to the resistor 108 to produce EMF and charge. The EMF produced may cause current flow in the Shottky diode 1 302 and Shottky diode 2 304 resulting in increase of the total current through the solar cell 102. In one or more embodiments, additional heat may be generated on the surface of the opaque pyroelectric film 106 which gets heat from the Sun and/or wasted heat, through connections and layers that may not be depicted in the FIG. 3. In one or more embodiments, the heat generated by the current through the resistor 108 caused by the Shottky e.g., Shottky diode 1 302 may be temporary and it wears down within a short period, such as a second or lesser, in the next small period, e.g., 1 second, current passes through Shottky diode 2 304 which also heats a resistor (not shown in Figure), creating the same cycle again. A temporal temperature gradient dT/dt may be created in this manner. In one or more embodiments, temporal temperature gradient dT/dt may be a temporary physical quantity that describes in which direction and at what rate the temperature changes the most in the pyroelectric material of the solar cell 102. In one or more embodiments, the temporal temperature gradient dT/dt may be required to generate EMF through the pyroelectric material. In one or more embodiments, a constant temporal temperature gradient may be created in the opaque pyroelectric film 106 to increase the short circuit current with the increase in temperature of the opaque pyroelectric film 106.

Figure 4:
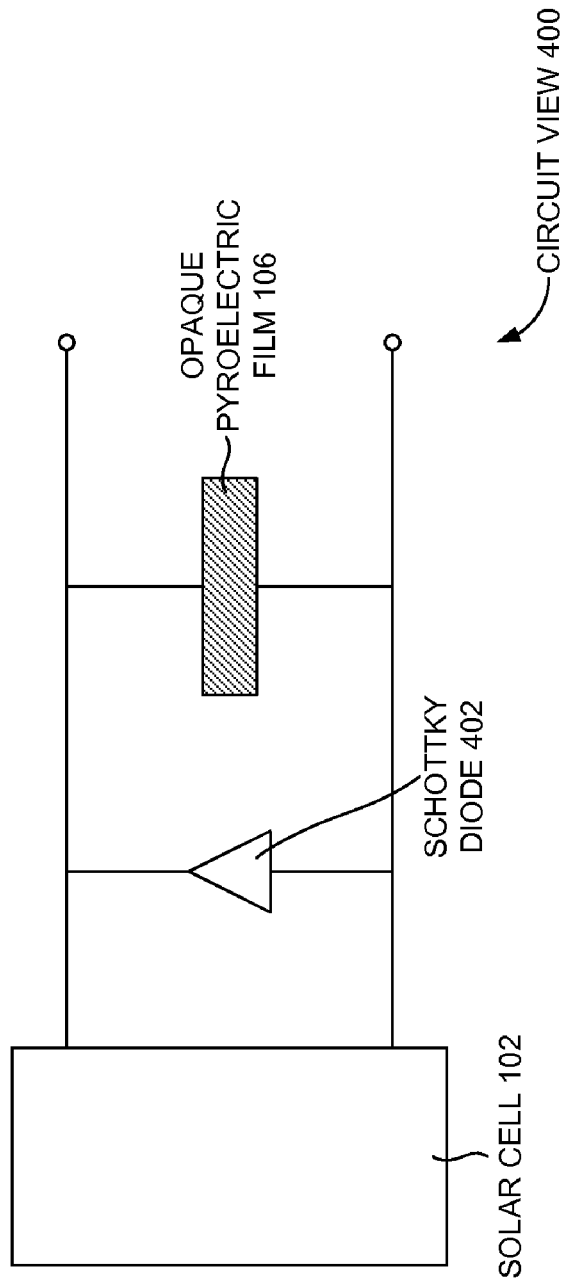
FIG. 4 is a schematic view of a circuit representing a solar cell, according to one or more embodiments.

FIG. 4 shows a circuit view 400, according to one or more embodiments. In one or more embodiments, circuit view 400 may represent a method to connect a generation device such as a Shottky diode 402 with opaque pyroelectric film 106 and solar cell 102 to increase the short circuit current through the opaque pyroelectric film 106. In one or more embodiments, the short circuit current through the opaque pyroelectric film 106 may be increased using Shottky diode, Zener diode, Avalanche diode, and/or PIN diode. Thus, a sustained temperature variation may be created in the solar cell due to this increase in the short circuit current through the opaque pyroelectric film 106. In one or more embodiments, current source represented by pyroelectric effect may be parallel to current source represented by the solar cell as shown on FIG. 4. In one or more embodiments, EMF produced by the opaque pyroelectric film 106 may be further used to generate electric current using a generation device such as a Shottky diode 402. The generated current may increase the short circuit current of the solar cell, thus increasing the power of the solar cell 102.

In one or more embodiments, the solar cell 102 may include the opaque pyroelectric film 106, a semiconductor such as a Shottky diode 402 provided directly on the surface of the solar cell 102. In one or more embodiments, the solar cell 102 may also comprise of the opaque pyroelectric film 106 applied on the surface of the semiconductor with the semiconductor.

In one or more embodiments, the temporal temperature gradient may be generated on the solar cell 102 through a standing infra red wave through the opaque pyroelectric film and/or stack of pyroelectric films. In one or more embodiments, the temporal temperature gradient may be generated on the solar cell 102 with pyroelectric material films of varying specific heats and conductivities at a front and/or back of the solar cell. In one or more embodiments, transparent pyroelectric film 104 may comprise of a polyvinylidene fluoride, a tri-glycerin sulphate, a lead zirconatetitanate, a stannic titanate, a lithium tantalate, lithium niobate, aluminum nitride, titanium aluminum nitride, barium titanate, and/or barium strontium titanate. In one or more embodiments, opaquepyroelectric film 106 may comprise of a polyvinylidene fluoride, a tri-glycerin sulphate, a lead zirconatetitanate, a stannic titanate, a lithium tantalate, lithium niobate, aluminum nitride, titanium aluminum nitride, barium titanate, and/or barium strontium titanate.

In one or more embodiments, the semiconductor diode provided on the surface of the solar cell 102 may comprise of biasing diode, Shottky diode, Zener diode, and/or PIN diode.

Figure 5:
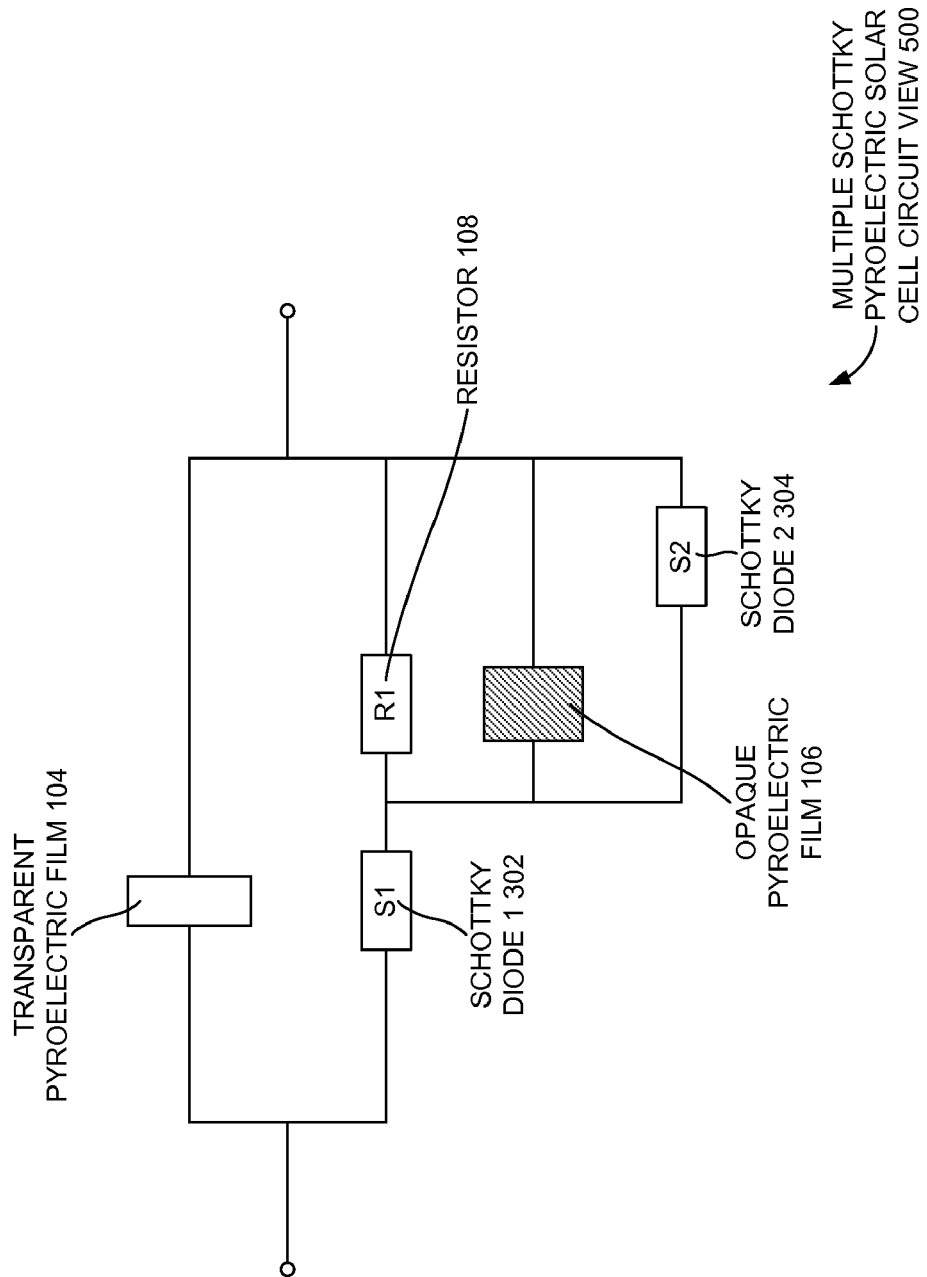
FIG. 5 is a schematic representation of the multiple Shottky pyroelectric solar cell circuit, according to one or more embodiments.

FIG. 5 shows multiple Shottky pyroelectric solar cell view 500, according to one or more embodiments. In one or more embodiments, the transparent pyroelectric film 104 may be heated to create a current through the Shottky diode 1 302, which heats resistor 108. In one or more embodiments, current through the Shottky diode 1 302 may increase the short circuit current of the solar cell 102. In one or more embodiments, the short circuit current through the solar cell 102 may be available for a short period of time. In one or more embodiments, the duration of availability of the short circuit current may vary from less than a second to several seconds. In one or more embodiments, the heat generated by the resistor 108 may be also available for a short period of time and the heat generated by the resistor 108 may cause EMF on the opaque pyroelectric film 106. In one or more embodiments, the opaque pyroelectric film 106 may cause current through Shottky diode 2 304, thus increasing the short circuit current of the solar cell 102 for the period when the current through the Shottky diode 1 302 goes down. In one or more embodiments, when current through the Shottky diode 2 304 is available, another resistor (not shown in FIG. 5) may also be heated. Another resistor that may be heated in turn may add to the heat on the surface of the transparent pyroelectric film 104. In one or more embodiments, surface of the transparent pyroelectric film 104 may receive heat from the Sun and/or other wasted heat, increasing the temporal temperature gradient dT/dt between two surfaces of the transparent film 104. Thus, a continuous increase in the short circuit current through the solar cell 102 may be achieved.

Figure 6:
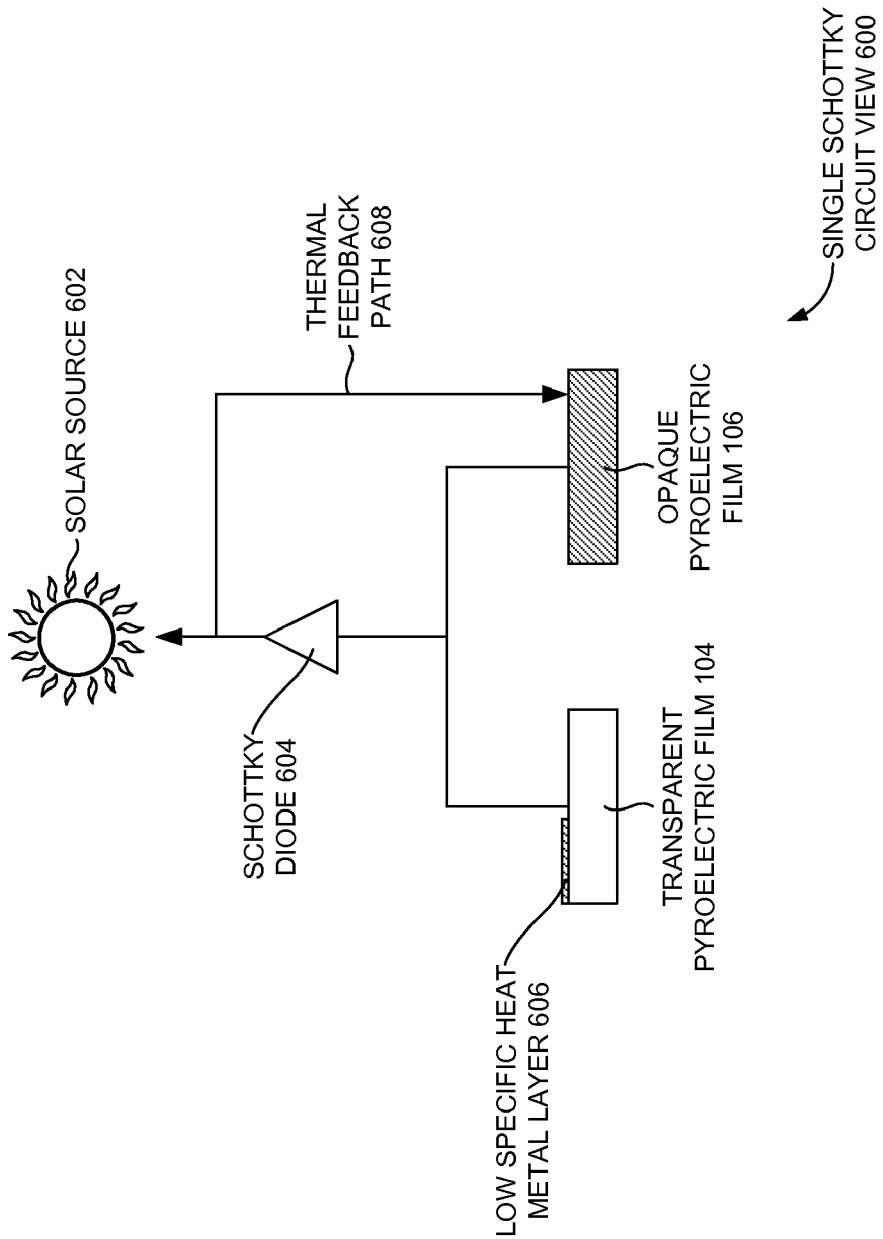
FIG. 6 is a schematic representation of single Shottky circuit, according to one or more embodiments.

FIG. 6 shows a single Shottky circuit view 600, according to one or more embodiments. In one or more embodiments, implementation of FIG. 5 may be accomplished using a single Shottky diode 604. Shottky diode 1 302 and Shottky diode 2 304 may be combined to use only one Shottky diode 604 in FIG. 6. In one or more embodiments, a low specific heat metal layer 606 may be used in contact with the top layer of the transparent pyroelectric film 104. In one or more embodiments, low specific heat metal layer 606 may be heated faster than metal layers with a high specific heat, by sources such as solar source 602. In one or more embodiments, low specific heat metal layer 606 heats very fast and may enhance the temporal temperature gradient dT/dt required by the transparent pyroelectric film 104. In one or more embodiments, a thermal feedback path 608 may be used from the output end of the Shottky diode 604 to the opaque pyroelectric film 106.

In one or more embodiments, the power of the solar cell 102 may be a product of the open circuit voltage and the short circuit current. In one or more embodiments, electrical resistance of semiconductor device such as a Shottky diode 604 may have a negative increase or reduction when temperature increases. In one or more embodiments, when a negative thermal coefficient of resistance material may be used in the solar cell 102, a reduction in resistance with solar heating increases the shot circuit current through the pyroelectric material thereby increasing the solar power. In one or more embodiments, a low doping material may be used to create negative thermal coefficient of resistance.

Figure 7:
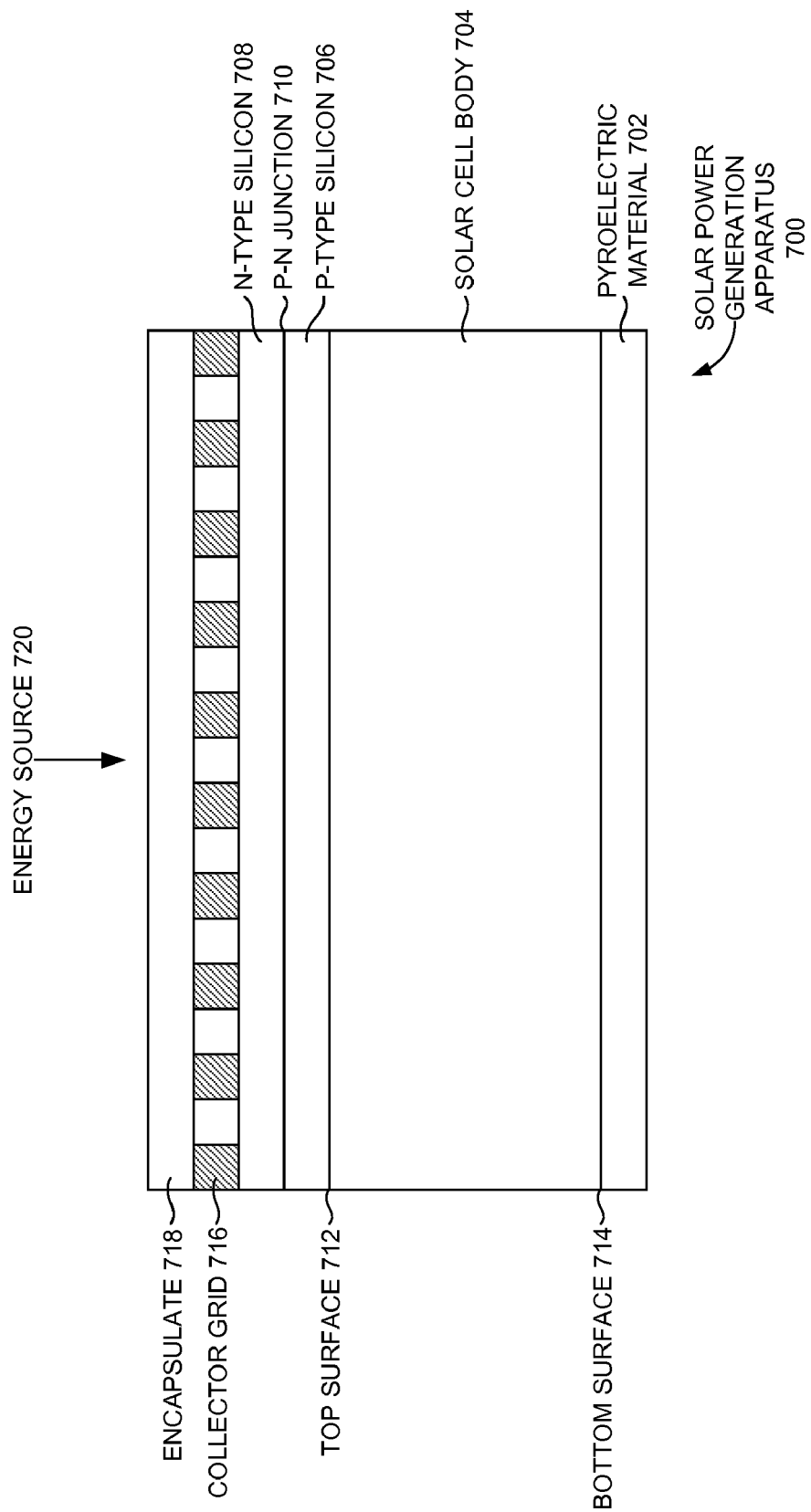
FIG. 7 is a schematic representation of solar power generation apparatus, according to one or more embodiments.

FIG. 7 shows a solar power generation apparatus 700, according to one or more embodiments. In one or more embodiments, solar cell 102 may include a solar cell body 704 with a top surface 712 and a bottom surface 714. In one or more embodiments, a layer of p-type silicon 706 may be disposed on the top surface of the solar cell 102. Additionally, a layer of n-type silicon 708 may be disposed on top of the p-type silicon 706. In one or more embodiments, a p-n junction 710 may be formed in the region between the p-type silicon 706 and the n-type silicon 708. As shown in FIG. 7, a collector grid 716 may be disposed on top of the N-type layer 110 and an encapsulate 718 may be desirably disposed on top of the collector grid 716 to protect the solar cell 102. In one or more embodiments, the collector grid 716 may be a current collector wiring provided on the pyroelectric material 702. In one or more embodiments, a semiconductor e.g., p-n junction 710 and/or a combination of pyroelectric material 702 and semiconductor may be provided directly on the collector grid 716. In one or more embodiments, the transparent pyroelectric film 104 and opaque pyroelectric film 106 may be deposited on the top surface 712 and bottom surface 714 of the solar cell body 704. In another embodiment, the deposition of films on the surfaces may be reversed.

In one or more embodiments, solar cell 102 includes one or more layers of the pyroelectric material 702 disposed on the bottom surface 714 of the solar cell body 704. In one or more embodiments, the pyroelectric material 702 may be disposed on the top surface 712 of the solar cell body 704 and/or disposed on both the top surface 712 and the bottom surface 714 of the solar cell body. In another embodiment, the pyroelectric material 702 may be disposed within and/or between the layers of components of the solar cell body 704. In one or more embodiments, the pyroelectric material 702 may be optically transparent (e.g., transparent pyroelectric film 104) or opaque material (e.g., opaque pyroelectric film 106).

In one or more embodiments, the energy source 720 may be the Sun. In one or more embodiments, sunlight from the Sun may also include ultraviolet rays. In one or more embodiments, sunlight from the energy source 720 may strike the solar cell 102, due to this energy striking the surface of the solar cell 102 heat is generated and collected by the solar cell 102. The heat may travel from the solar cell body 704 towards the pyroelectric material 702. In one or more embodiments, heating of the pyroelectric material 704 may produce an electric field across the pyroelectric material 704 due to the electromotive force generated. However, the pyroelectric material 702 may produce electrical power, only when a temporal thermal gradient dT/dt exists between the top surface 712 and bottom surface 714 of the pyroelectric material 702.

In an example embodiment, a solar cell assembly may include multiple pyroelectric assemblies. The solar cell 102 may include two or more stacks of pyroelectric element assemblies. Each pyroelectric assembly may include an assembly that in turn includes a solar cell which desirably includes two or more stacks of pyroelectric element assemblies. In particular, the assembly may include a first pyroelectric assembly and a second pyroelectric assembly, both of which are disposed on the bottom surface of the solar cell 102. The first pyroelectric assembly desirably may include a first metal layer having a top surface and a bottom surface in which the top surface of the first metal layer may be desirably disposed on a bottom surface 714 of the solar cell body 704. Additionally, a first pyroelectric element may be disposed on the first metal layer and may have a top surface and a bottom surface, whereby the top surface of the first pyroelectric element may be desirably disposed on the bottom surface of the first metal layer. As described above, the layers of pyroelectric elements and metal layers may be stacked in an alternating configuration to maximize the temporal thermal gradient dT/dt in each of the pyroelectric elements in the stack.

A thermally conductive intermediate member may be coupled to the first pyroelectric assembly and the second pyroelectric assembly. In particular, the intermediate conductive member may be coupled to the first metal layer in the first pyroelectric assembly and the last metal layer in the second pyroelectric assembly. The intermediate conductive member may transfer heat from the first metal layer to the last metal layer of the pyroelectric assembly.

In an example embodiment, one or more layers of pyroelectric material may be deposited onto a layer of metal deposited on a substrate, which may be silicon or a similar substrate. A pyroelectric and/or a piezoelectric material may be disposed between two electrodes. The pyroelectric and/or a piezoelectric material may create an electric field that creates positive and negative charges at each of the electrodes. Incident energy onto an electrode may be absorbed by the electrode. Black body radiation may be emitted by the electrode into the pyroelectric and/or a piezoelectric material. The pyroelectric and/or a piezoelectric material may get charged and cause mechanical oscillations in the pyroelectric and/or a piezoelectric material. These oscillations may generate photons. The photons may get reflected by the other electrode. Oncoming and reflected photons may create standing waves that create local thermal oscillations inside the pyroelectric and/or a piezoelectric material that in turn may give rise to electric current.

In an example embodiment, two pyroelectric elements may be used. The first pyroelectric element may be polarized when subjected to heat. The electric field produced due to polarization may be used to reduce the electric field from a second pyroelectric. Electric charge may then be removed from the first pyroelectric using a standard technique such as an RC discharge. As soon as the charge from the first pyroelectric may be discharged, the electric field from the first pyroelectric becomes low and the polarization is unsaturated. The electric field from the second pyroelectric and the heat from the surrounding may increase the polarization in the first pyroelectric. The second pyroelectric may now be discharged using a standard method, such as RC discharge, the above cycle may be repeated continuously to produce continuous power.

In another example embodiment, the pyroelectric material may be applied to the solar cell in the form of a stacked multilayer structure. The Pyroelectric may be for example LiTaO$_3$. Pyroelectric material stacks may be coupled to the back of a solar cell. In an example embodiment, a plurality of pyroelectric material stacks may be coupled to the solar cell, the solar cell may include a metal layer that is exposed to heat (for e.g., exposed to solar energy). As a result of the change in temperature, positive charges and negative charges may move to opposite ends due to the polarization of the pyroelectric material. Hence, an electric potential may be established. Negative thermal coefficient of resistance (TCR) in a material may cause the reduction of resistance in the material when the material is subjected to heat. In one or more embodiments, doping in a semiconductor may be tailored to create negative TCR. Thus, reduction of the resistance of the material may increase the current that increases the power.

In yet another example embodiment, a method to increase the efficiency of a solar cell may include depositing a pyroelectric film on a surface of the solar cell and generating an electromotive force to bias the solar cell wherein an open circuit voltage is created. Further, the method may include increasing a short circuit current through the pyroelectric film and creating a sustained temperature variation in the solar cell. Still further, the method may include creating a constant temporal temperate gradient in the pyroelectric film to increase the short circuit current with a temperature and biasing a p-n junction of the solar cell with the electromotive force produced from the pyroelectric film.

In yet another example embodiment, a solar cell may include a pyroelectric film, a semiconductor device provided directly on a surface of the solar cell and the pyroelectric film deposited on the surface of the solar cell that includes the semiconductor device. Further, the pyroelectric film may include one of a polyvinylidene fluoride, a tri-glycerin sulphate, a lead zirconate titanate, a stannic titanate, and a lithium tantalate. The solar cell may include the semiconductor diode provided directly on the surface of the solar cell. The semiconductor diode may include one of a Schottky diode, a Zener diode, and a PIN diode. The solar cell may include a current source that may be represented by the pyroelectric film in parallel to a current source represented by the solar cell. The solar cell includes the pyroelectric film that may be deposited directly below the surface of the solar cell. The solar cell that includes the pyroelectric may in turn include the semiconductor device deposited on it. The deposition of the semiconductor may be through one of a sputtering and a screen printing.

In a further example embodiment, a photovoltaic power generation apparatus may include a solar cell, a current collecting wiring provided on of a transparent pyroelectric film and an opaque pyroelectric film. The photovoltaic power generation device may further include a semiconductor device provided directly on the current collecting wiring. The transparent pyroelectric film may be deposited on a first side of the solar cell and the opaque pyroelectric film may be deposited on a second side of the solar cell.

Although the present embodiments have been described with reference to specific example embodiments, it will be evident that various modifications may be made to these embodiments without departing from the broader spirit and scope of the various embodiments.

In addition, it will be appreciated that the various operations, processes, and methods disclosed herein may be embodied in a machine-readable medium and/or a machine accessible medium compatible with a data processing system (e.g., computer devices), and may be performed in any order (e.g., including means for achieving the various operations). Accordingly, the specification and the drawings are regarded in an illustrative rather than a restrictive sense.

What is claimed is:
1. A method comprising:
   depositing a resistive layer directly on top of a surface of a solar cell;

depositing a stack of transparent pyroelectric films directly on top of a surface of the resistive layer;

depositing a stack of opaque pyroelectric films directly on another surface of the solar cell such that the solar cell is bookended by the stack of opaque pyroelectric films and a combination of the stack of transparent pyroelectric films and the resistive layer;

depositing another resistive layer directly below a surface of the stack of opaque pyroelectric films;

channeling solar heat into the stack of transparent pyroelectric films and the stack of opaque pyroelectric films to generate an electromotive force;

depositing a first semiconductor diode layer in combination with the stack of opaque pyroelectric films and the another resistive layer and a second semiconductor diode layer in combination with the stack of transparent pyroelectric films and the resistive layer such that current flow through the first semiconductor diode layer and the second semiconductor diode layer due to heat produced in the another resistive layer and the resistive layer leads to an increased total current through the solar cell;

creating a sustained temperature variation in the solar cell in accordance with an increased current through the stack of transparent pyroelectric films and the stack of opaque pyroelectric films based on the channeling;

creating, through varying at least one of a specific heat and a conductivity across at least one of the stack of opaque pyroelectric films and the stack of transparent pyroelectric films, a constant temperature gradient in the at least one of the stack of opaque pyroelectric films and the stack of transparent pyroelectric films to increase the current therethrough with an increase in temperature; and biasing a p-n junction of the solar cell with the electromotive force generated.

* * * * *